United States Patent [19]
Jones, Jr.

[11] Patent Number: 6,097,191
[45] Date of Patent: Aug. 1, 2000

[54] TESTING HIGH INTENSITY DISCHARGE LAMP FIXTURES

[75] Inventor: Dalma B. Jones, Jr., Cary, N.C.

[73] Assignee: Carolina Power & Light Company, Raleigh, N.C.

[21] Appl. No.: 08/929,584

[22] Filed: Sep. 15, 1997

Related U.S. Application Data

[62] Division of application No. 08/619,200, Mar. 21, 1996, abandoned.

[51] Int. Cl.⁷ .................................................... G01R 31/00
[52] U.S. Cl. ........................................... 324/414; 324/410
[58] Field of Search .................................... 324/414, 403, 324/410

[56] References Cited

U.S. PATENT DOCUMENTS

| | | | |
|---|---|---|---|
| 2,619,619 | 11/1952 | Trevor, Jr. ................................ | 324/410 |
| 2,749,510 | 6/1956 | Rively ..................................... | 324/414 |
| 2,754,476 | 7/1956 | Wallach . | |
| 2,909,724 | 10/1959 | Onksen et al. ........................... | 324/414 |
| 3,249,859 | 5/1966 | Speros et al. ............................ | 324/414 |
| 3,361,958 | 1/1968 | Martin ..................................... | 324/414 |
| 3,967,191 | 6/1976 | Roche ...................................... | 324/414 |
| 4,019,128 | 4/1977 | Chebowski .............................. | 324/414 |
| 4,323,841 | 4/1982 | Jacobsen ................................. | 324/414 |
| 4,496,905 | 1/1985 | Forte et al. .............................. | 324/414 |
| 4,617,519 | 10/1986 | Rosenthal . | |
| 4,695,803 | 9/1987 | Rue ......................................... | 324/414 |
| 4,730,163 | 3/1988 | Santos ..................................... | 324/414 |
| 5,323,116 | 6/1994 | Atria ........................................ | 324/414 |
| 5,332,970 | 7/1994 | El-Hamamsy .......................... | 324/414 |
| 5,744,961 | 4/1998 | Otaka ...................................... | 324/414 |

OTHER PUBLICATIONS

"HPS Ballast Testing", Carolina Power & Light Company (1990) (no month).
Luma–Tester (Area Lighting Research, Inc.) (no date).
The Super Beast (H.J. Arnett Industries, Inc.) (no date).

*Primary Examiner*—Josie Ballato
*Assistant Examiner*—Jose M. Solis
*Attorney, Agent, or Firm*—Richard S. Faust

[57] ABSTRACT

A diagnostic device and associated operational procedure are used to both verify the integrity of components of high intensity discharge light fixtures and also troubleshoot problems in the wiring connecting the light fixture to the AC power source (transformer). The diagnostic device is a rugged, self-contained unit that can be connected across the ballast in the fixture for verifying component integrity, while also being adapted to load the AC power line that powers the fixture to detect problems in the wiring between the AC power source and the fixture.

20 Claims, 6 Drawing Sheets

ADD - ON ADAPTER PACK SCHEMATIC

DIAGNOSTIC DEVICE SCHEMATIC

TESTING HIGH INTENSITY DISCHARGE LAMP FIXTURES

This is a division of application Ser. No. 08/619,200, filed Mar. 21, 1996 now abandoned.

FIELD OF THE INVENTION

The present invention relates to high intensity discharge lamp fixtures (typically, street lights) such as high pressure sodium fixtures, mercury vapor fixtures and metal halide fixtures. More particularly, the invention relates to a diagnostic apparatus and associated procedure useful for (i) verifying the operational integrity of newly installed fixtures and (ii) troubleshooting improperly operating fixtures to determine the source of problems.

BACKGROUND OF THE INVENTION

High intensity discharge (HID) lamps provide the vast majority of lighting for streets, parking lots and other areas requiring security lighting. At present, there is no quick, simple, reliable method to verify the operational integrity of a newly installed light fixture. For example, sometimes the ballast in such a fixture is wired for one voltage and the line voltage is not compatible. According to current practices, if the newly installed lamp tries to ignite, the installation is generally considered good, and this is not always the case. Consequently, often ballasts are destroyed during the first few days of operation. Even if the newly installed fixture does not burn up, but is simply nonoperational, the owner of the installation typically has to prove that the installation is incorrect before the installing contractor can be required to reinstall the fixture. Furthermore, problems such as short lamp life, caused by lamps being overdriven by excessive ballast current, do not show up for months or years. These incurred costs to the fixture owner, for example an electric utility company, are not recoverable.

Throughout the electric utility industry, and for other owners of large numbers of HID light fixtures, an excessive amount of labor and material is being wasted in the repair/troubleshooting of the fixtures. Even under the best specifications utilized in the industry, the troubleshooting operation is a hit or miss proposition. The checks are often inconclusive. Thus, the troubleshooting operation often becomes a process of changing parts until the lamp ignites, which may or may not have solved the underlying problem. Even if the problem happens to be properly solved, many times parts (e.g., lamps, photocontrols, starters, complete fixtures) are installed that may not have been needed and the time spent troubleshooting is excessive. Those familiar with the troubleshooting procedures are aware of numerous revisits to the same fixture location where the source of the true problem is repeatedly missed.

Lastly, those installing new fixtures or troubleshooting malfunctioning fixtures tend to focus on replacing components in the fixture because available diagnostic tools and procedures lead them in this direction, when the problem quite often is in the wiring connecting the light fixture to the AC power source (transformer).

Accordingly, there is an acute need for a diagnostic device and an associated operational procedure for use throughout the electrical utility industry to permit the verification of the operational integrity of light fixtures at the time they are installed and to permit truly effective and efficient troubleshooting of nonoperational fixtures, including the identification of problems in the wiring connecting the light fixture to the AC power source.

SUMMARY OF THE INVENTION

The diagnostic apparatus of the present invention is a reliable, portable, and easy-to-use means for testing the operational integrity of newly installed HID fixtures and carrying out troubleshooting operations on such fixtures. The diagnostic device is a rugged, self-contained unit that is specially adapted for use by working personnel in the bucket by which the personnel are raised to the level of the fixture.

Customers, for example electric utilities, who utilize contractors to install new fixtures may require the contractors to use the diagnostic device and operational procedures of the invention to verify each new installation. If the verification test reflects a problem, such as an improper ballast current, the contractor is then required to identify the source of the problem and fix it before burning up fixtures and before the contractor turns over the installation to the customer. This verification process, not currently employed as standard procedure in the industry, will offer substantial cost avoidance to the owners and operators of fixtures.

Also, line and service employees responsible for troubleshooting of HID light fixtures can utilize the diagnostic device and operational procedures of the invention to more reliably locate the actual problem associated with a malfunctioning fixture, including problems in the wiring connecting the fixture to the AC power source, thereby permitting repair of the fixture in one visit and at lower cost.

In one aspect, the present invention may be defined as a diagnostic device useful (i) to verify the integrity of a new installation of a high intensity discharge (HID) light fixture and (ii) to trouble-shoot an improperly operating HID light fixture. This device comprises a testing circuit including a fixed resistive load having a resistance value that lies in the range of resistances offered by the variety of conventional HID lamps subject to testing by said device, an ammeter and a momentary switch, with the resistive load, ammeter and switch being connected in series. The device also includes means for connecting the testing circuit across the ballast in a fixture being tested and means for comparing the current reading of the ammeter when the testing circuit is connected across a ballast to a known correct current associated with the lamp size and fixture type being tested. The resistance value of the resistive load may be in the range from approximately 15 ohms to 45 ohms. The means for connecting the testing circuit across the ballast may comprise an adapter for fitting into the socket of the fixture. Furthermore, the means for comparing the current reading to a known correct value may comprise a plurality of indicia on the face of the ammeter at selected current value locations such that each indicium represents a correct current value for a particular lamp size and fixture type.

In another aspect, the invention may be defined as an operational procedure for troubleshooting a high intensity discharge (HID) light fixture of the type having a lamp of known wattage and type and a ballast connected in series with the lamp and an AC power line, the operational procedure being useful to both verify the integrity of fixture components and trouble-shoot problems in the wiring connecting the light fixture to the AC power source. This procedure comprising the steps of momentarily connecting a testing circuit having, in series, a fixed resistance and an ammeter, across the ballast of a fixture being tested to generate a current reading on the ammeter and then comparing the current reading to a known correct current value associated with the lamp size and fixture type being tested. When the current reading corresponds to the known correct current value, the operator replaces the lamp or repairs the starter in the fixture. When the current reading does not correspond to the known correct current value, the operator tests the integrity of the wiring connecting the light fixture to the AC power source by connecting the testing circuit to load the AC line that powers the fixture, while also monitoring the AC line voltage, and thereafter repairs or replaces the fixture if the current/voltage readings are normal, or corrects an AC power line problem if the current/voltage readings are abnormal. This procedure may be expanded to trouble-shoot day-burner fixtures by first replacing the fixture photocontroller and thereafter, if dayburning continues, connecting the testing circuit to load the AC line that powers the fixture, while also monitoring the AC line voltage, and thereafter repairing or replacing the fixture to correct a defective neutral connection/lead inside the fixture if the current/voltage readings are normal, or repairing the neutral feed line if the current/voltage readings are abnormal.

BRIEF DESCRIPTION OF THE DRAWINGS

Some of the objects having been stated, other objects will appear as the description proceeds, when taken in connection with the accompanying drawings, in which.

DETAILED DESCRIPTION OF THE INVENTION

While the present invention will be described more fully hereinafter with reference to the accompanying drawings, in which aspects of the preferred manner of practicing the present invention are shown, it is to be understood at the outset of the description which follows that persons of skill in the appropriate arts may modify the invention herein described while still achieving the favorable results of this invention. Accordingly, the description which follows is to be understood as being a broad, teaching disclosure directed to persons of skill in the appropriate arts, and not as limiting upon the present invention.

Representative Light Fixture

Figure 1:
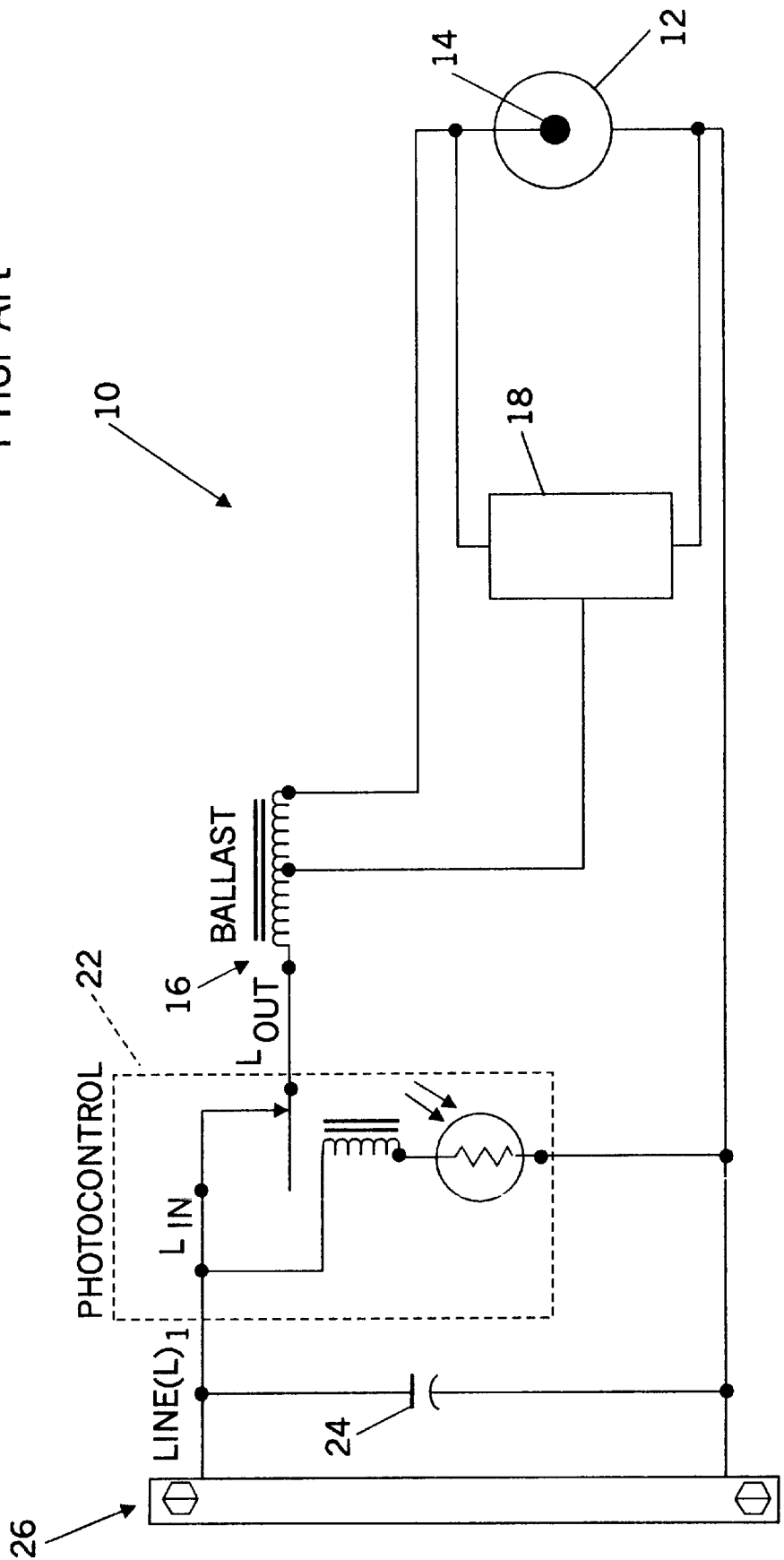
FIG. 1 is a schematic representation of a typical high pressure sodium light fixture.

Referring to FIG. 1, there is shown a schematic representation of a typical high pressure sodium (HPS) light fixture 10 of the prior art. The characteristics of fixture 10 and its failure modes will first be described followed by a detailed discussion of the diagnostic device and operational procedures of the present invention.

Fixture 10 is a typical HPS streetlight including an HPS lamp 12 positioned in socket 14, a ballast 16, a starter circuit 18, a light-activated switch or photocontrol 22 and a capacitor 24. Lamp 12 and ballast 16 are connected in a series fashion with the AC power line 26.

The HPS lamp is classified as a discharge tube, and its theory of operation is similar to that of common fluorescent tubes and mercury-vapor lights. HPS lights operate by passing an electrical current through a glass envelope which is filled with sodium vapor. This electrical current ionizes the vapor, which glows, producing a brilliant yellow-orange light.

When a voltage is first applied to the HPS lamp (necessary to induce current flow), the sodium vapor is not yet ionized, making it non-conductive and unable to allow the necessary current flow. To start the lamp, it is necessary to produce some ionization in the vapor. This is performed by the starter circuit, which applies high-voltage (2500 to 4000 volt) pulses to the lamp. These electrical pulses partially ionize the sodium vapor, allowing it to carry current.

The light-activated switch is simply a means for turning the light fixture on and off, depending on the ambient light at the site.

The remaining component, the ballast, is an electrical circuit which is connected in a series fashion with the HPS lamp and the AC power line. It presents a reactive impedance to the line, and serves to limit the voltage applied to the HPS lamp. The electrical characteristics of the ballast are selected to match the needs of the HPS lamp being used.

The lighting fixture may include a capacitor connected across the AC power line (in parallel with the ballast/lamp combination). It serves primarily to correct the power factor of the fixture (the ballast is usually an inductor). Strictly speaking, the capacitor may not be necessary to make the HPS fixture work. However, it is usually a component of such fixtures, and should be considered in the evaluation of failures.

Failure Modes in HPS Fixtures

Obviously, one failure mode is the HPS lamp. Lamp failure can be caused by normal aging, by a failure in another component, or by improper installation.

The ballast can fail in an open-circuit mode, in which it does not conduct electrical current to the lamp.

Likewise, the ballast can fail in a short-circuit mode, in which case it allows too much current to flow through the lamp.

Additionally, the ballast can be out-of-specification (without being shorted or open), thus allowing too much or too little current to flow through the lamp. This usually occurs when a capacitor within the ballast circuit has become defective or changes value, or when the ballast is tapped for the wrong line voltage or when the wrong ballast has been installed for the lamp.

The starter and light-activated switches can fail. Utility service personnel have adequate procedures for diagnosing these failures.

The wiring connecting the light fixture to the AC power source (transformer) can be a source of problems, with undersized conductors and/or bad connections. Also, the fixture may be miswired to the AC power source itself, e.g., an open-neutral or neutral tied to a ground wire.

Description of One Preferred Embodiment

Figure 2:
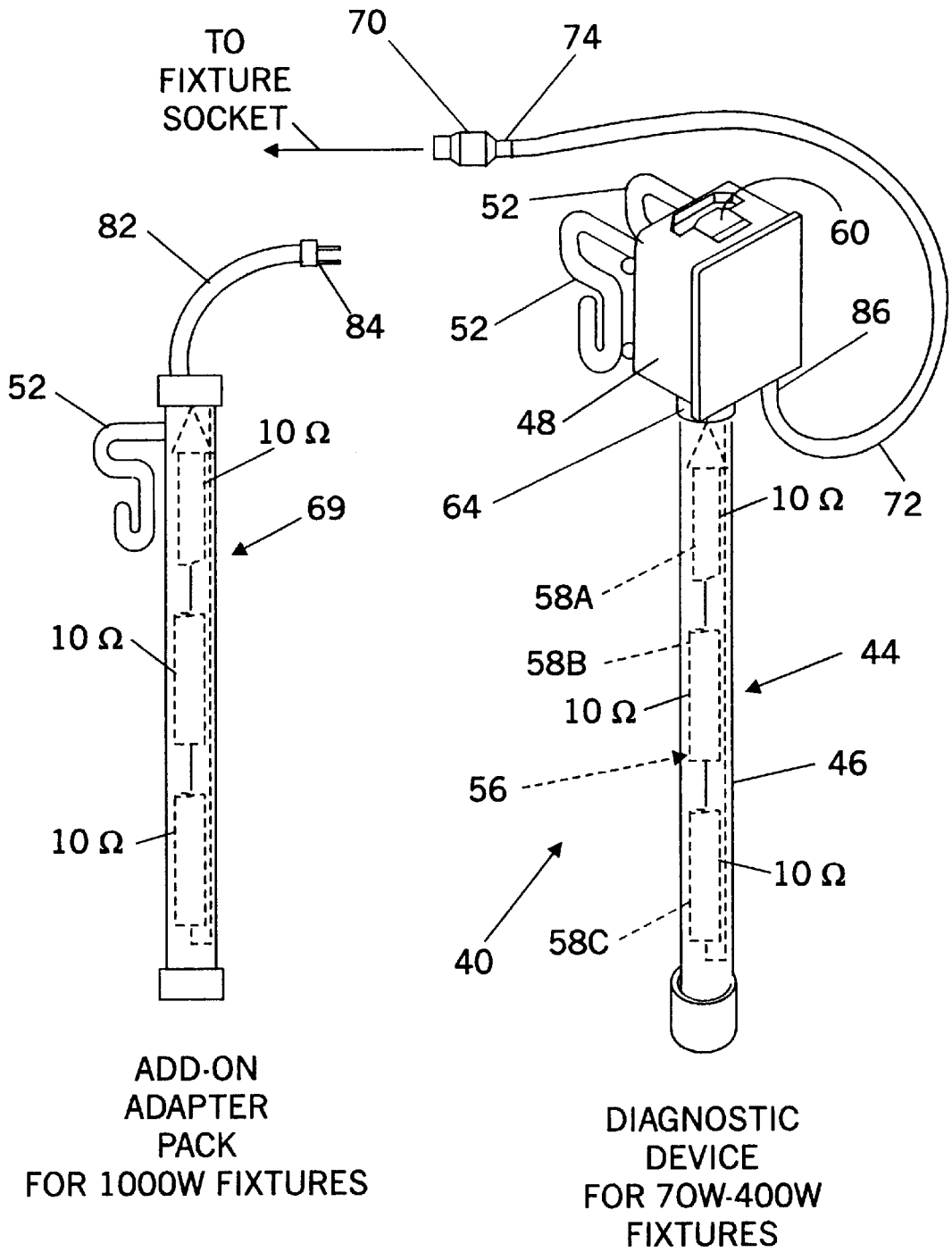
FIG. 2 illustrates a diagnostic device of the present invention showing the basic unit and an add-on adapter pack.
Figure 3:
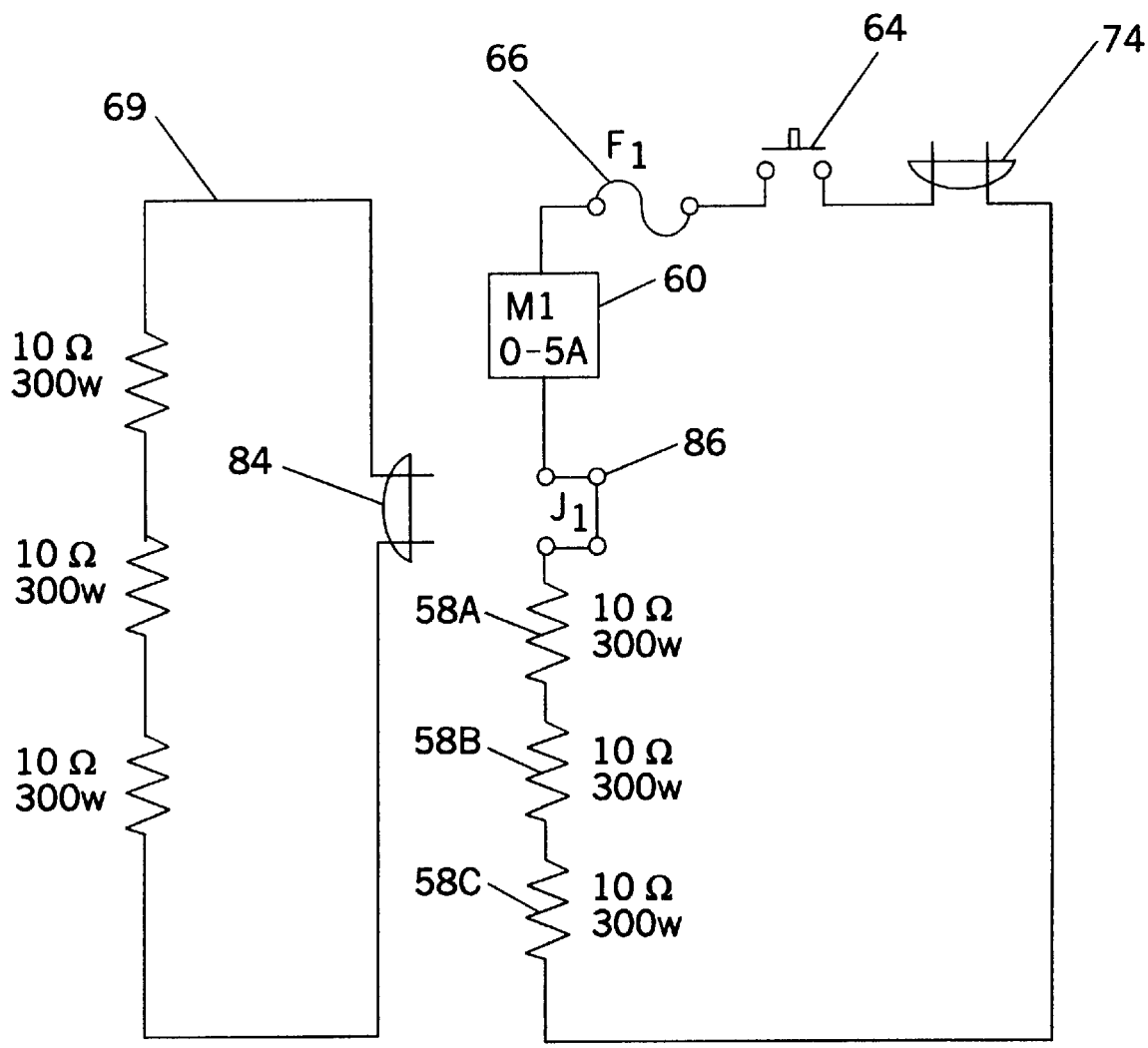
FIG. 3 is a schematic representation of the components illustrated in FIG. 2.

Referring to FIGS. 2 and 3, the diagnostic device 40 of the present invention includes a rugged housing 44 formed from a cylindrical tubular member 46 such as PVC pipe material and a cap member 48 enclosing the top of the tubular member. Cap member 48 mounts a pair of clips 52 sized to permit device 40 to be hung on the upper lip of a conventional bucket (not shown) of the type used to raise and lower working personnel when installing or repairing HID light fixtures. In the illustrated embodiment, device 40 (without the later-discussed add-on adapter pack) is approximately 32 inches in height, tubular member 46 is approximately 2⅜ inches in diameter and the device has an overall weight of 9¼ lbs., rendering the device easily usable by line service personnel working out of elevated buckets.

Housing 44 encloses a resistive load 56, in the illustrated embodiment a 30-ohm load formed by three 10 ohm, 300 watt resistors 58A, 58B, 58C in series. The preferable resistors are wire wound type resistors that are held in place by contact with the inner walls of the tubular member 46 with intervening packing such as foam rubber, or the like. Additionally, silicone sealing may be used at the top and bottom of the resistors. This configuration permits the heat generated during short tests (e.g., 5 to 15 seconds) to be sufficiently dissipated.

An analog ammeter 60 is connected in series with the resistive load to provide a readout of the current flowing through the device during testing. The ammeter face, shown in greater detail in FIG. 4, may be conveniently positioned to be easily seen by the working personnel, for example, at the top of cap member 48.

A momentary-contact switch 64, for example a normally open push button switch, and a fuse 66 are included in the circuit as shown. Switch 64 may be conveniently positioned at the bottom of cap member 48, as shown.

Electrically, the resistive load, ammeter, switch and fuse are connected in a series fashion. In operation, this series circuit is connected across the output of the ballast (in place of the HID lamp) in the fixture being tested. This connection may be best achieved by use of an adapter that screws into the fixture socket, such as a medium to mogul lamp adapter 70. Adapter 70 is connected to the circuit of device 40 by an A/C retractable line cord 72 provided with a plug 74.

The value of the resistance of resistive load 56 preferably is chosen to lie in a range of the resistances offered by a wide variety of conventional HID lamps and to significantly load the supply lines. This resistance is fixed (constant)and preferably in the range of 15 ohms to 45 ohms for use with 70 W to 400 W fixtures. Thus, when the circuit is connected across the output of the ballast, the ballast impedance can be determined by making a current measurement read at the ammeter. In accordance with the invention, the operator compares each measured current with a range of current values which correspond to the known impedance values of the ballast types used in conventional HID lamp fixtures.

Figure 4:
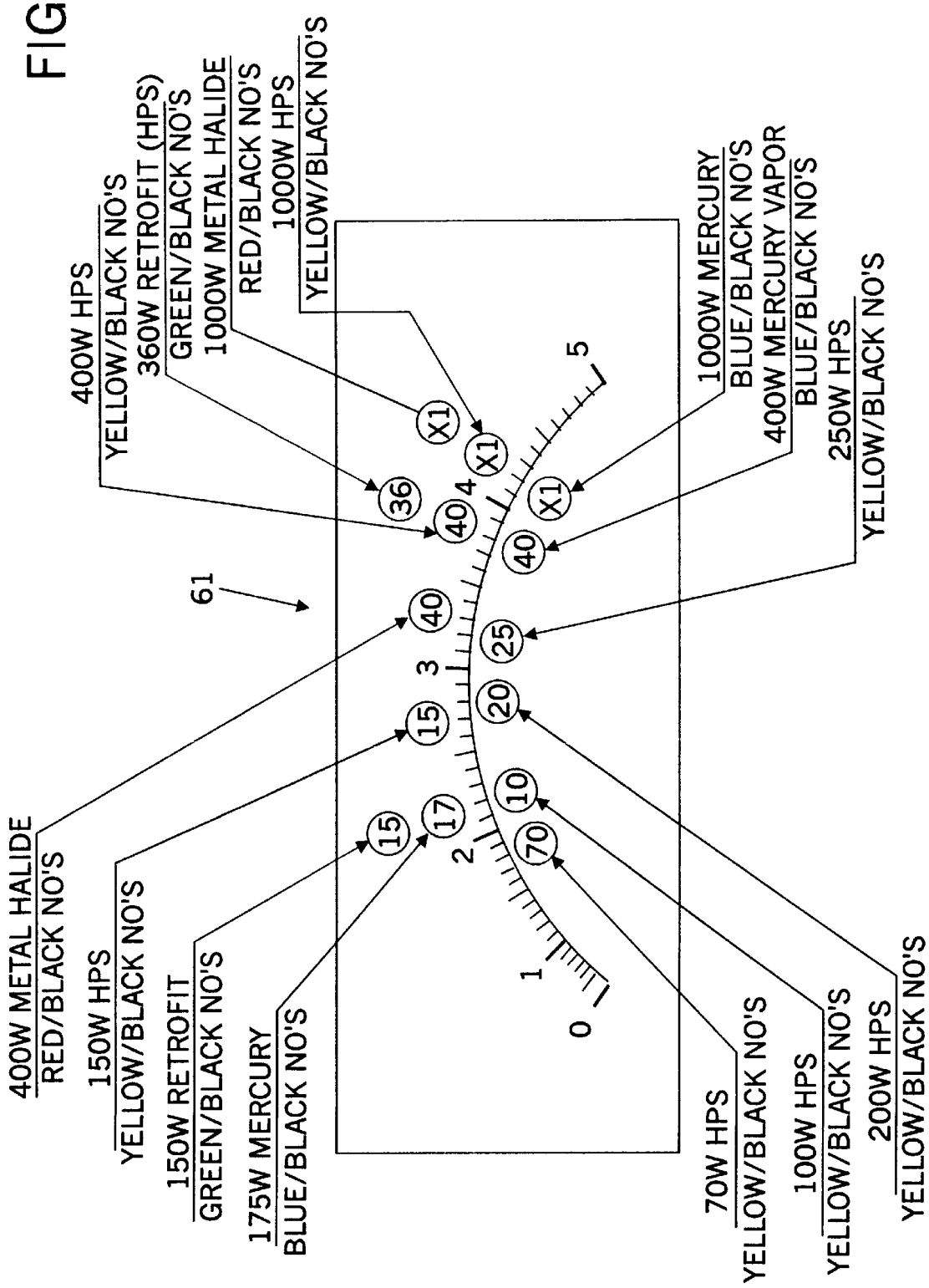
FIG. 4 is an enlarged view of the ammeter of the diagnostic device showing on the face thereof indicia in the form of dots that correspond to the correct current readings for each of the multiple fixture configurations commonly used in the industry.

Referring to FIG. 4, ammeter 60 includes a meter scale 61 that ranges from zero to five amps in the illustrated embodiment. The meter scale is provided with indicia on the face thereof that indicate the correct range of current for each conventional fixture type. Thus, the operator can visually determine whether the current reading for each test falls at the correct indicia. In the illustrated embodiment, the indicia take the form of color-coded dots on the meter scale. Yellow dots/black numbers are used for HPS fixtures, red dots/black numbers for metal halide fixtures, blue dots/black numbers for mercury vapor fixtures and green dots/black numbers for retrofit fixtures. Thus, the number in each dot indicates wattage of the lamp and the background color indicates lamp type.

As briefly mentioned above, the basic device 40 is intended for use with 70 W–400 W fixtures. For use with 1000 W fixtures, or when device 40 is to be used to load a 208V to 270V feed line (usually 240V), it has been determined that a higher resistance is preferred over the 30 ohm resistance discussed above in order to more closely approximate the resistance offered by a 1000 W lamp. Therefore, an add-on adapter pack 69 is provided to plug into the circuit to boost the resistance to a higher value, in this case to 60 ohms total. Adapter pack 69 includes a rugged housing similar to that of device 40. The housing encloses three additional 10 ohm resistors in series that are added to the resistive load of device 40 by means of a cord 82 and plug 84 that interface with a jack 86 at the cap 48. While the additional resistors could be housed in housing 44 of the basic unit, the add-on pack is preferred to keep the weight of the basic unit at a minimum, especially since the add-on pack is necessary for only a small percentage of tests.

Operational Procedure

Figure 5:
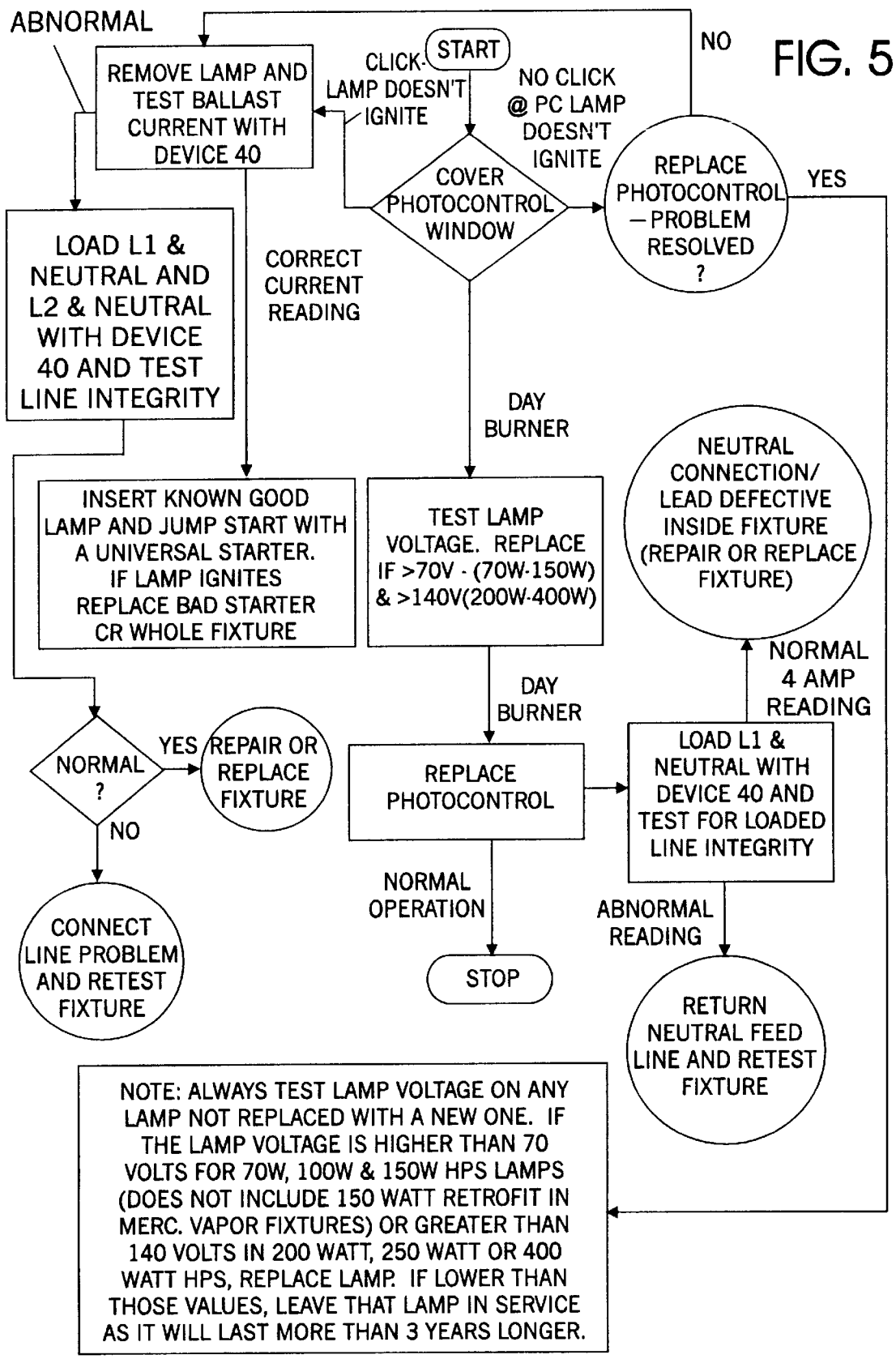
FIG. 5 is a flow sheet showing the operational procedure of the invention for use in troubleshooting high pressure sodium lamp fixtures.

Referring to FIG. 5, to use the diagnostic device 40 on an inoperative HPS fixture (preferably after verifying the integrity of the photocontrol), the operator removes the HPS lamp from its socket, and connects the retractable cord to that socket via adapter 70. Next, the momentary-contact switch 64 is activated, and the indicated current at ammeter 60 is compared to the nominal current for the ballast type in the fixture being tested. If the reading is in the correct range as indicated by the ammeter needle overlying the correct color-coded dot, then the operator installs a known-good lamp and "jump-starts" the fixture with a known-good starter circuit. If the lamp lights, the problem had to be with the starter circuit. The remedy is to replace the bad starter or the whole fixture.

If ammeter 60 indicated an abnormal current reading (ammeter needle not at the correct color-coded dot), the connection of device 40 is moved so as to load the AC line which powers the fixture. The connection is made by removing adapter 70 from the socket and utilizing a suitable connector, for example alligator clips (not shown). Also, a separate voltmeter (not shown) is used to monitor the line voltage. Again, the momentary-contact switch 64 is activated, and the ammeter is checked. If the voltage and current readings are normal (i.e., 120V or 240V at 4 amps, within a tolerance of approximately ±5%) and there is no excessive voltage change when loaded, then the AC line is OK, and the problem is with the ballast. The remedy is to repair or replace the fixture. If the reading is too low or too high or the loading effect is significant, then the problem is in the AC supply to the fixture, and not necessarily in the ballast. The line problem must be located and repaired, followed by retesting the fixture.

In those cases where the fixture is a dayburner (i.e., the lamp is on in daylight conditions), the first obvious check is to replace the photocontrol which may solve the problem. However, if the fixture continues as a dayburner, the problem is with either a defective neutral feed line or a defective neutral connection/lead inside the fixture. In order to determine which of these two problems is causing the dayburner, device 40 is moved to load the AC line which powers the fixture in the manner described immediately above. If a normal four amp reading is obtained, then the problem is a defective neutral lead/connection inside the fixture. The remedy is to repair or replace the fixture. If the reading is abnormally high or low, then the problem is a defective neutral feed line and the remedy is to repair the defective line, followed by retesting the fixture.

Figure 6:
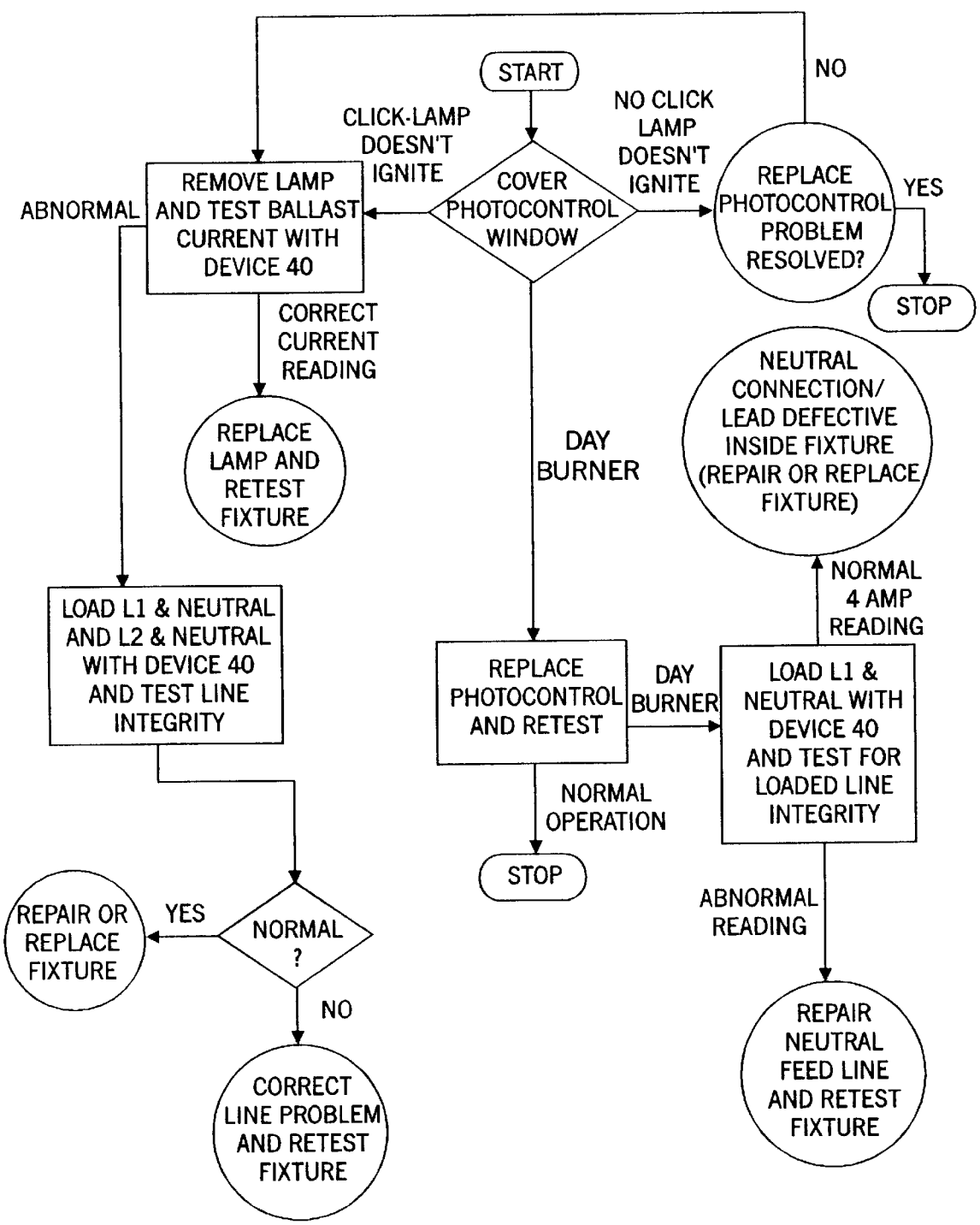
FIG. 6 is a flow sheet showing the operational procedure of the invention for use in troubleshooting mercury vapor and metal halide lamp fixtures.

Referring to FIG. 6, the operational procedure for mercury vapor and metal halide fixtures is similar to that for HPS fixtures with the exception that (i) these fixtures typically do not require starters and (ii) there is less need to incorporate lamp aging considerations into the procedure.

It will be appreciated that device 40 represents a novel diagnostic device having particular utility in the operational procedure of the invention. More particularly, device 40 serves as an ideal test device that can be connected across the ballast in the fixture being tested to verify the integrity of fixture components, while also being adapted to load the AC line which powers the fixture in order to trouble-shoot problems in the wiring connecting the light fixture to the AC power source (transformer).

While the invention has been described in connection with certain illustrated embodiments, it will be appreciated that modifications may be made without departing from the true spirit and scope of the invention.

That which is claimed is:

1. A diagnostic device useful (i) to verify the integrity of a new installation of a high intensity discharge (HID) light fixture having a lamp with electrode and (ii) to troubleshoot an improperly operating HID light fixture installation having a lamp with electrode, said device comprising:
   a housing having physical dimensions and weight characteristics permitting it to be carried with personnel raised and lowered in a bucket to the level of a fixture installation;
   a testing circuit carried by said housing, said testing circuit including a fixed resistive load having a resistance value that lies in the range of resistances offered by the variety of conventional HID lamps subject to testing by said device, an ammeter and a momentary switch, said resistive load, ammeter and switch being connected in series;
   an adapter for fitting into the socket of a fixture installation being tested for connecting the testing circuit across the ballast in the fixture installation; and
   said ammeter including a plurality of indicia on the face thereof at selected current value locations, each indicium representing a correct current value for a particular lamp size and fixture type in good working order, so that the reading of said ammeter may be compared to a known correct current reading for the particular fixture installation being tested when the testing circuit is connected across the ballast of the fixture and the momentary switch is activated.

2. The diagnostic device of claim 1 wherein said housing includes bucket engaging means thereon.

3. The diagnostic device of claim 1 including an add-on pack for incorporation into said testing circuit to increase the resistive load for testing high wattage lamp fixtures and/or to load a 208V to 270V line feed.

4. The diagnostic device of claim 3 wherein the device without the add-on pack has a resistive load on the order of 15 to 45 ohms and the device with the add-on pack has a resistive load of 50 to 70 ohms.

5. The diagnostic device of claim 1 wherein the resistance value of said resistive load is on the order of 30 ohms.

6. The diagnostic device of claim 1 wherein each indicium on the ammeter face includes a number indicating the wattage of the lamp of the particular lamp/fixture for which the indicium represents a correct current value.

7. The diagnostic device of claim 6 wherein each said indicium includes an indicator identifying the type of HID lamp/fixture it represents.

8. The diagnostic device of claim 7 wherein the indicator is a color, with a discrete color being provided for each of (i) high pressure sodium, (ii) mercury vapor and (iii) metal halide types of lamp/fixtures.

9. The diagnostic device of claim 7 wherein the resistance value of said resistive load in on the order of 30 ohms.

10. An operational procedure for in situ troubleshooting a high intensity discharge (HID) light fixture of the type having an electrode lamp of known wattage and vapor type and a ballast connected in series with the lamp and an AC power line, said operational procedure being useful to both verify the integrity of fixture components and trouble-shoot problems in the wiring connecting the light fixture to the AC power source, said procedure comprising the steps of:
   utilizing a portable diagnostic device having physical dimensions and weight characteristics permitting it to be carried by personnel raised and lowered in a bucket to the level of a fixture installation, momentarily connecting a testing circuit having, in series, a fixed resistive load and an ammeter, across the ballast of a fixture being tested to generate a current reading on the ammeter, wherein the fixed resistive load has a resistance value that lies in the range of resistances offered by the variety of conventional HID lamps subject to testing by the device;
   utilizing a comparison display provided by the ammeter, comparing the current reading to a known correct current value associated with the lamp wattage and fixture vapor type being tested;
   when the current reading corresponds to the known correct current value, replacing the lamp or repairing the starter in the fixture; and
   when the current reading does not correspond to the known correct current value, testing the integrity of the wiring connecting the light fixture to the AC power source by connecting said testing circuit to load the AC line that powers the fixture, while also monitoring the AC line voltage, and thereafter repairing or replacing the fixture if the current/voltage readings are normal, or correcting an AC power line problem if the current/voltage readings are abnormal.

11. The operational procedure of claim 10 including the step of utilizing a testing circuit with a resistive value in the range from about 15 to 45 ohms.

12. The operational procedure of claim 10 wherein said ammeter has indicia on the face thereof at selected current value locations such that each indicium represents a correct current value for a particular lamp wattage and fixture vapor type and including the step of comparing the ammeter current reading to a known correct current value by observing the position of the ammeter reading with respect to the indicia.

13. The operational procedure of claim 10 wherein the step of momentarily connecting the testing circuit is performed by fitting a mogul lamp adapter into the socket of the fixture being tested and thereafter pressing a momentary switch in the testing circuit.

14. The operational procedure of claim 10 including the step of troubleshooting dayburner fixtures by first replacing the fixture photocontroller and thereafter, if dayburning continues, connecting the testing circuit to load the AC line that powers the fixture, while also monitoring the AC line voltage, and thereafter repairing or replacing the fixture to correct a defective neutral connection/lead inside the fixture if the current/voltage readings are normal, or repairing the neutral feed line if the current/voltage readings are abnormal.

15. The operational procedure of claim 10 including the step of utilizing a resistive value in the testing circuit in the range of approximately 15 to 45 ohms for testing 70 W to 400 W fixtures and utilizing a higher resistive value for testing 1000 W fixtures.

16. The operational procedure of claim 15 wherein the higher resistive value is in the range from approximately 50 ohms to 70 ohms.

17. A diagnostic device useful (i) to verify the integrity of a new installation of a high intensity discharge (HID) light fixture having a lamp with electrode and (ii) to troubleshoot an improperly operating HID light fixture installation having a lamp with electrode, said device comprising:

a housing having physical dimensions and weight characteristics permitting it to be carried with personnel raised and lowered in a bucket to the level of a fixture installation;

a testing circuit carried by said housing, said testing circuit including a fixed resistive load having a resistance value that lies in the range of resistances offered by the variety of conventional HID lamps subject to testing by said device, and an ammeter connected in series with said resistive load;

means for connecting the testing circuit across the ballast in a fixture installation being tested; and said ammeter including a plurality of indicia, each indicium representing a correct current value for a particular lamp size and fixture type in good working order, so that the reading of said ammeter may be compared to a known correct current reading for the particular fixture installation being tested when the testing circuit is connected across the ballast of the fixture.

18. The diagnostic device of claim 17 wherein the resistance value of said resistive load is in the range from approximately 15 ohms to 45 ohms.

19. The diagnostic device of claim 17 wherein said means for connecting the testing circuit across the ballast comprises an adapter for fitting into the socket of the fixture.

20. The diagnostic device of claim 17 wherein said housing includes means for hanging the housing on the upper lip of a bucket used to raise and lower line service personnel.

* * * * *